US009799972B2

(12) United States Patent
Su

(10) Patent No.: US 9,799,972 B2
(45) Date of Patent: Oct. 24, 2017

(54) ELECTRICAL CONNECTOR HAVING A PLURALITY OF SOCKETS ATTACHED TO AN INTERIOR CROSS STRUCTURE AND EXTERIOR PERIPHERAL STRUCTURE OF A FRAME

(71) Applicant: FOXCONN INTERCONNECT TECHNOLOGY LIMITED, Grand Cayman, KY (US)

(72) Inventor: Po-Yuan Su, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/369,835

(22) Filed: Dec. 5, 2016

(65) Prior Publication Data

US 2017/0162963 A1 Jun. 8, 2017

(30) Foreign Application Priority Data

Dec. 4, 2015 (CN) .................... 2015 2 0991966 U

(51) Int. Cl.

| | |
|---|---|
| ***H01R 12/00*** | (2006.01) |
| ***H01R 12/71*** | (2011.01) |
| ***H01R 13/514*** | (2006.01) |
| ***H01R 12/52*** | (2011.01) |

(52) U.S. Cl.

CPC ........... *H01R 12/716* (2013.01); *H01R 12/52* (2013.01); *H01R 13/514* (2013.01)

(58) Field of Classification Search

CPC ........ H01R 9/091; H01R 9/096; H01R 12/52; H01R 12/714; H01R 12/716; H01R 12/72; H01R 13/2442; H01R 23/72

USPC ...................................................... 439/68–74

See application file for complete search history.

(56) References Cited

U.S. PATENT DOCUMENTS

| | | | | |
|---|---|---|---|---|
| 6,679,707 | B1 * | 1/2004 | Brodsky | H05K 3/325 361/760 |
| 6,881,073 | B2 * | 4/2005 | Bali | H01R 13/2414 439/594 |
| 7,517,256 | B2 * | 4/2009 | Chang | H01R 13/518 439/701 |
| 7,819,669 | B2 * | 10/2010 | Liao | H01R 13/514 439/66 |
| 8,002,558 | B2 * | 8/2011 | Liao | H05K 7/1061 439/65 |
| 8,267,701 | B2 * | 9/2012 | Beaman | H01L 23/4006 439/68 |
| 9,368,890 | B1 * | 6/2016 | Liao | H01R 12/7082 |
| 2008/0153322 | A1 * | 6/2008 | Liao | H05K 7/1069 439/68 |

FOREIGN PATENT DOCUMENTS

| | | |
|---|---|---|
| CN | 201112688 Y | 9/2008 |

* cited by examiner

*Primary Examiner* — Chandrika Prasad

(74) *Attorney, Agent, or Firm* — Wei Te Chung; Ming Chieh Chang

(57) ABSTRACT

The electrical connector includes a frame to assemble a plurality of socket thereto. Each socket includes a plurality of contacts, two inner sides in confrontation with the neighboring sockets, and two outer sides in confrontation with the frame. The frame includes an exterior peripheral structure and an interior cross structure. The outer sides are attached to the exterior peripheral structure while the inner sides are attached to the interior cross structure.

8 Claims, 7 Drawing Sheets

173 171 17 172 16 19 12 19 18 15 24 20 23 21 22 11 13 14

19 19 19

19
19
19

ELECTRICAL CONNECTOR HAVING A PLURALITY OF SOCKETS ATTACHED TO AN INTERIOR CROSS STRUCTURE AND EXTERIOR PERIPHERAL STRUCTURE OF A FRAME

BACKGROUND OF THE INVENTION

1. Field of the Invention

The present invention relates to an electrical connector, and particularly to a modular socket assembly.

2. Description of Related Art

U.S. Pat. No. 7,819,669 discloses an electrical connector with a square frame to which four square sockets are secured via the pins of the socket extending through the corresponding holes in the frame. To each socket, two outer sides are attached to the frame and two inner sides are attached to the neighboring sockets so as to form a four-side attachment thereof. Anyhow, such an arrangement is relatively hard for assembling and/or keeping the desired coplanar condition for all four sockets.

An improved electrical connector with flexibility of adjustment of the numbers of the corresponding terminal/cable, is desired.

SUMMARY OF THE INVENTION

Accordingly, the object of the present invention is to provide an electrical connector to connect the central processor to the printed circuit board. The electrical connector includes a frame to assemble a plurality of socket thereto. Each socket includes a plurality of contacts, two inner sides in confrontation with the neighboring sockets, and two outer sides in confrontation with the frame. The frame includes an exterior peripheral structure and an interior cross structure. The outer sides are attached to the exterior peripheral structure while the inner sides are attached to the interior cross structure.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
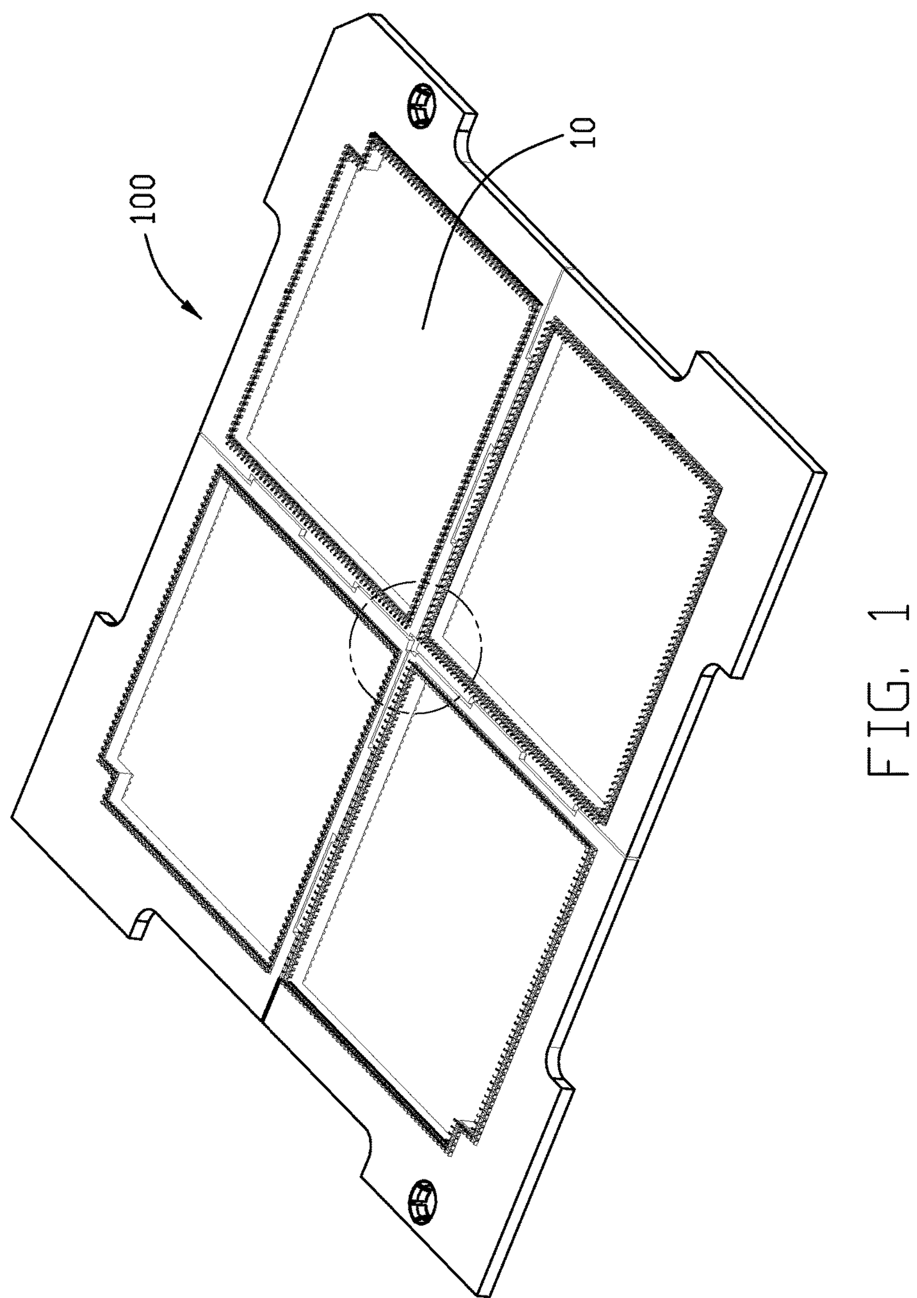
FIG. 1 is a downward assembled perspective view of an electrical connector according to the presently preferred embodiment of the invention.
Figure 2:
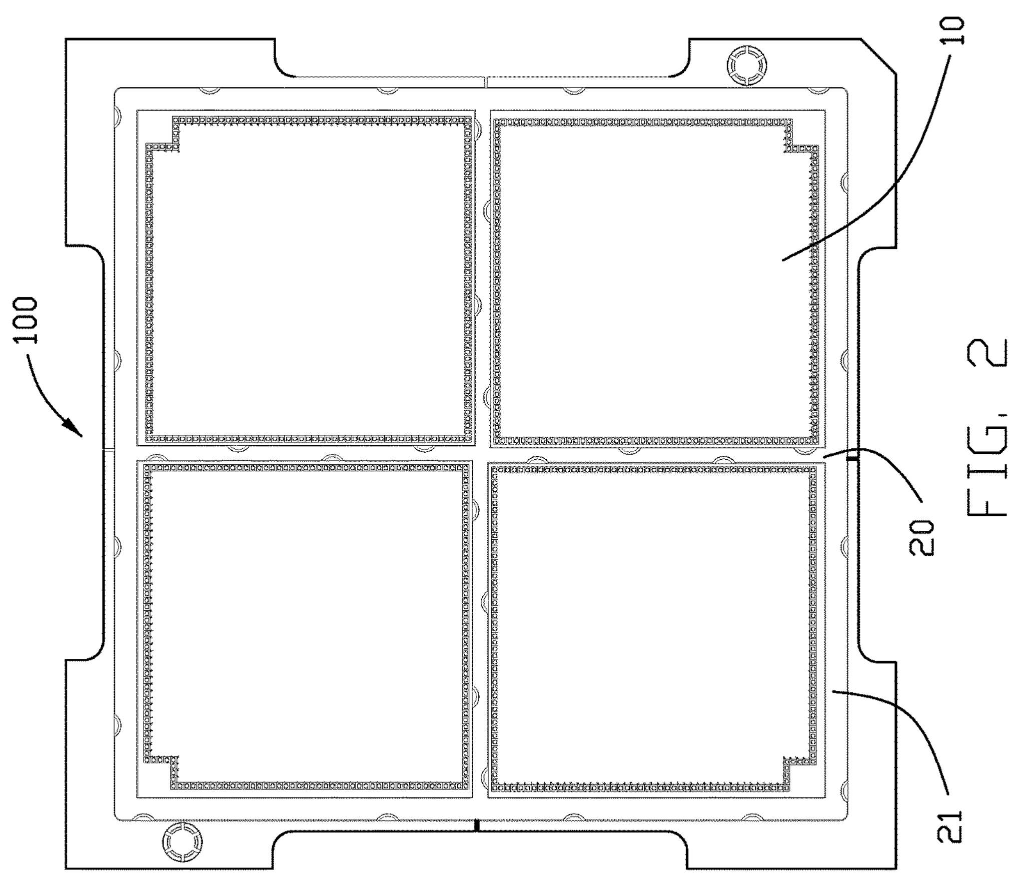
FIG. 2 is a bottom view of the electrical connector FIG. 1.
Figure 3:
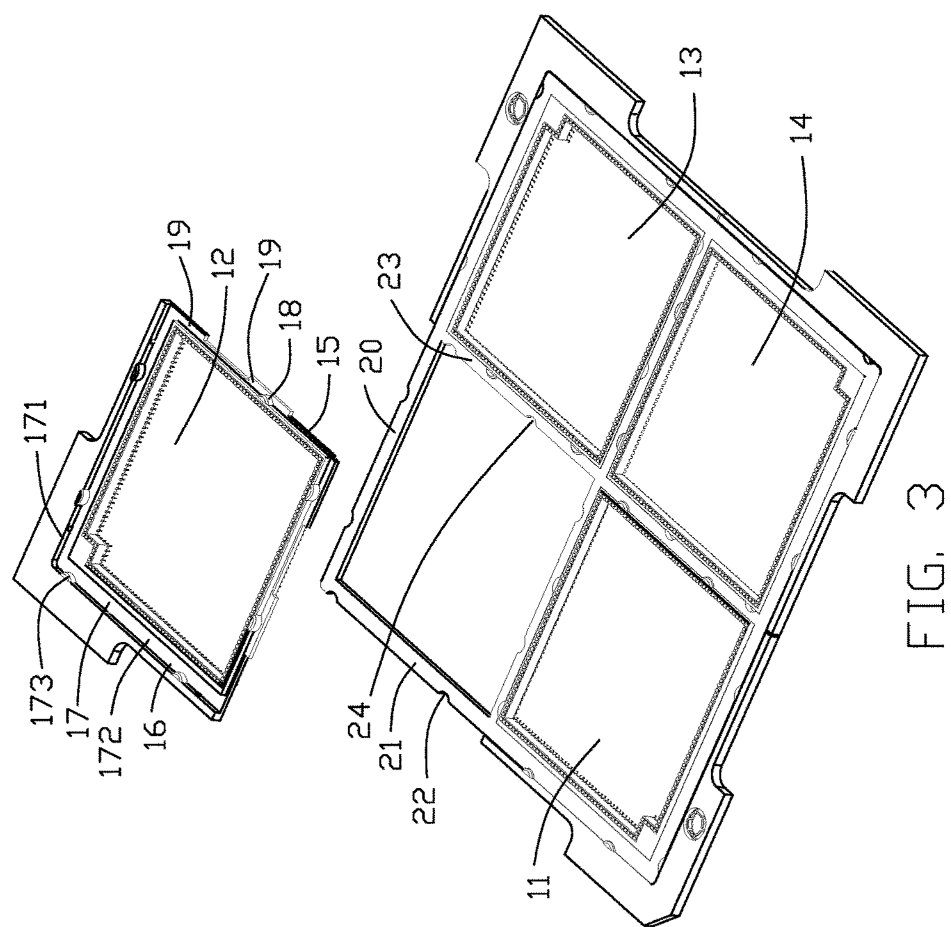
FIG. 3 is an upward partially exploded perspective view of the electrical connector of FIG. 2.
Figure 4:
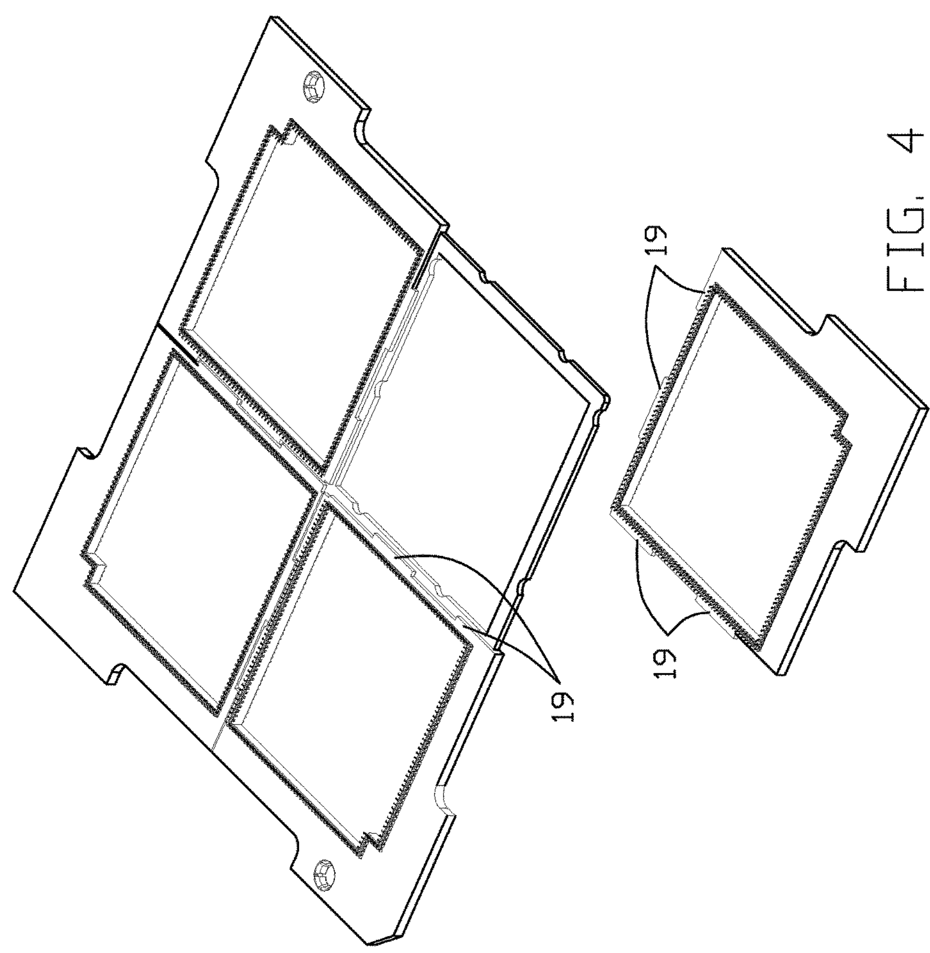
FIG. 4 is a downward partially exploded perspective view of the electrical connector of FIG. 3.
Figure 5:
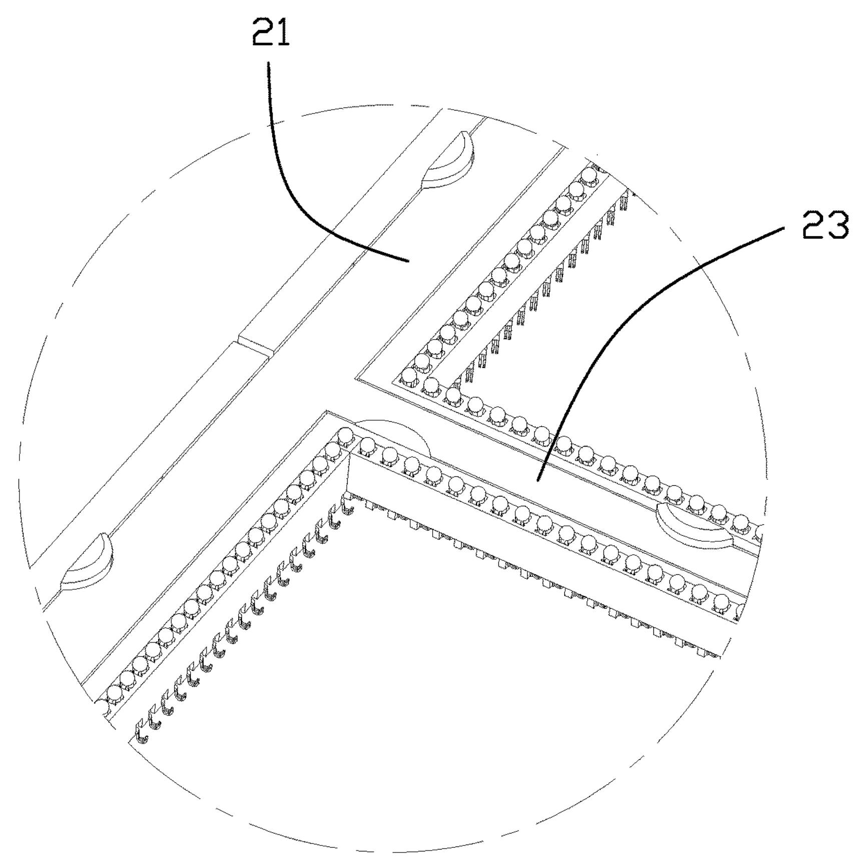
FIG. 5 is an enlarged partial upward assembled perspective view of the electrical connector of FIG. 3.
Figure 6:
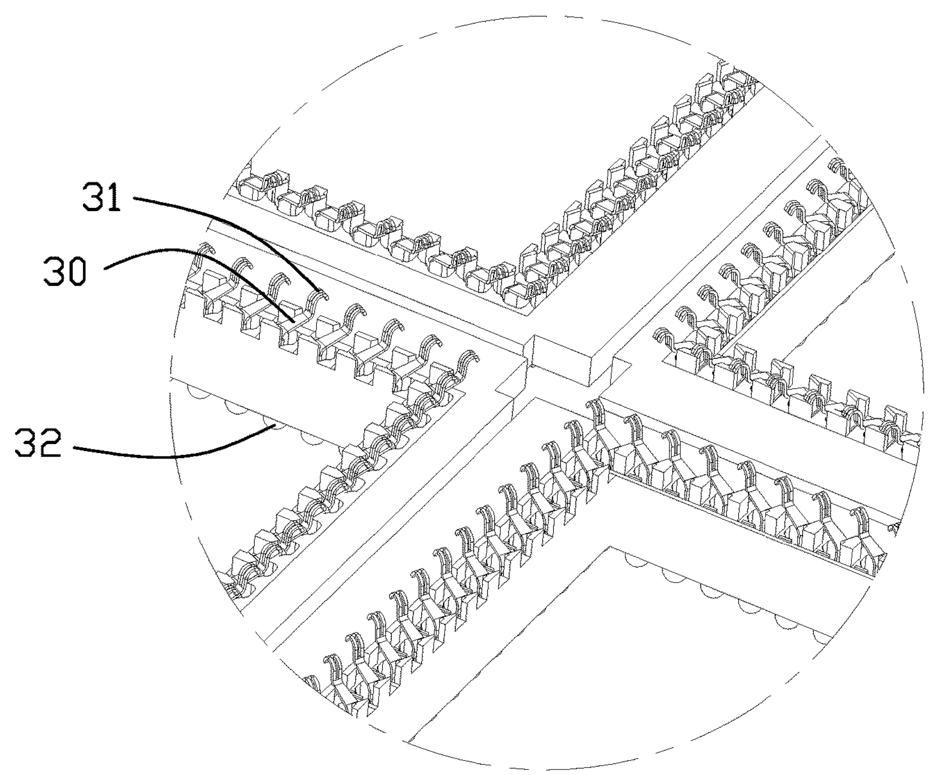
FIG. 6 is an enlarged partial downward assembled perspective view of electrical connector of FIG. 4.
Figure 7:
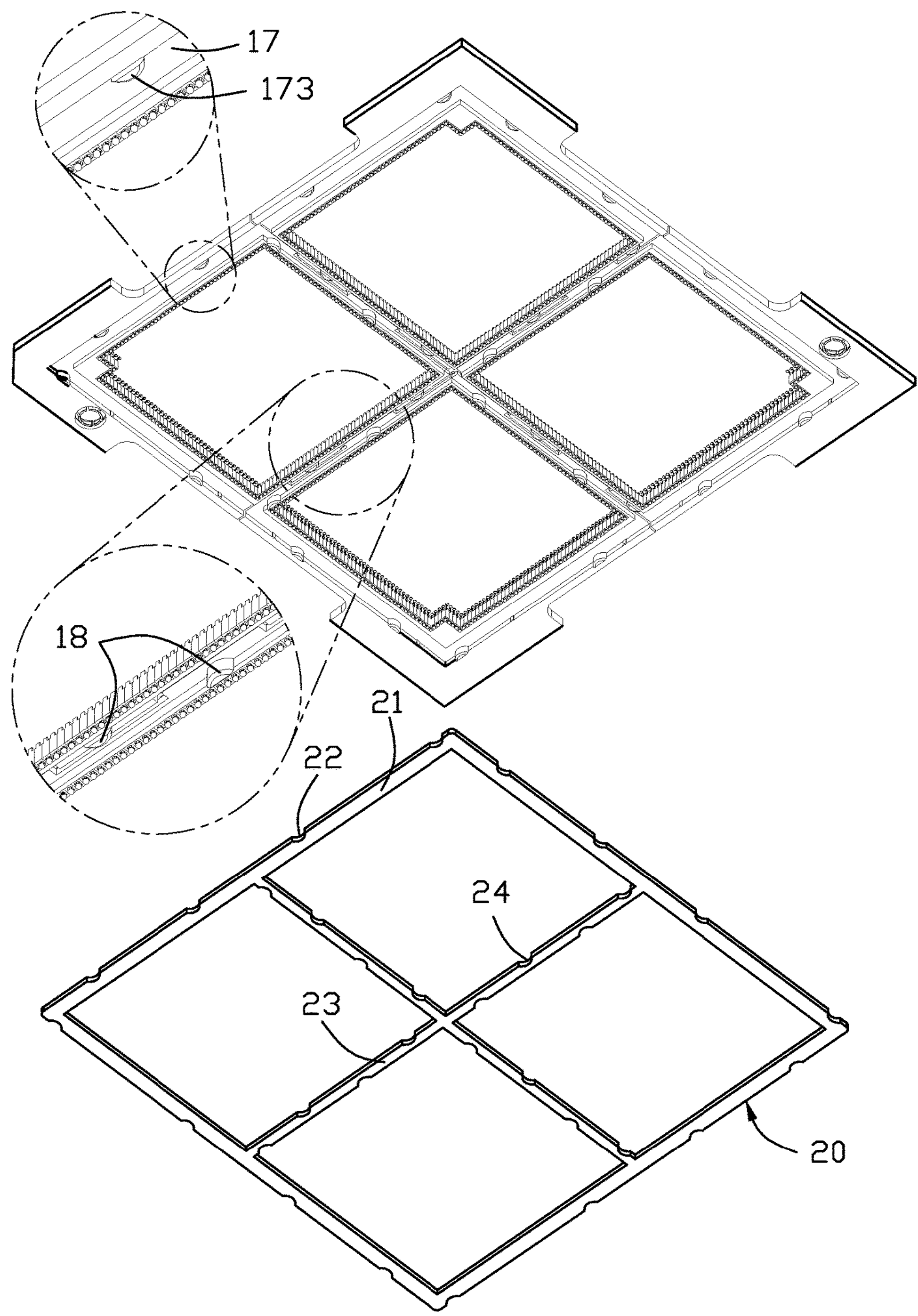
FIG. 7 is an upward exploded perspective view of the electrical connector of FIG. 1 to show the slot or slot structure in an underside of the sockets, which is adapted to snugly receive the peripheral structure and the cross structure of the frame during assembling.

Referring to FIGS. 1 to 7, an electrical connector 100 includes a frame 20 defining receiving units in matrix, and a plurality of sockets 10 attached thereto. In this embodiment, there are four sockets occupying the respective quadrants. Understandably, the combination of any matrix numbers may be available.

The socket 10 has an insulative housing (not labeled) which is essentially square or rectangular. A plurality of contacts 30 are disposed in the housing. Each contact 30 includes an upper contacting section 31 and a lower solder ball 32. The socket 30 further forms two inner sides 15 and two outer sides 16 opposite to the inner sides 15, respectively. In this embodiment, the four socket are numbered as the units 11, 12, 13 and 14, respectively, wherein the unit 11 and the unit 13 are diagonally arranged with each other and the unit 12 and the unit 14 are diagonally arranged with each other.

The frame 20 includes an exterior peripheral structure 21 and an interior cross structure 23 inside the peripheral structure 21. The inner sides 15 are attached to the cross structure 23 while the outer sides 16 are attached to the peripheral structure 21. The outer side 16 forms a slot 17 to snugly receive the peripheral structure 21. The inner side 15 forms a plurality of protrusions 19 so as to cooperate with the corresponding protrusions 19 of the neighboring socket 10 to be alternately arranged with one another along the inner side 15 in a zigzag or staggered manner. The slot 17 forms two engagement vertical planes 171 and two supporting planes 171 connected to the vertical planes 171. A plurality of engagement rivets 173 are formed on the vertical planes 171, and the peripheral structure 21 forms the corresponding notches 22 to compliantly receive the engagement rivets 173, respectively. Similarly, the inner side 15 forms the engagement rivets 18 around the corresponding protrusion 19 to be snugly received within the corresponding notches 24 formed in the cross structure 23. Understandably, the rivet 173 and rivet 18 are deformed after assembled for securing the socket 10 and the frame together without the relative movement therebetween in the vertical direction. In this embodiment, for each socket 10, the engagement rivets 173 on the outer side 16 and the engagement rivets 18 on the opposite inner side 15, both direct to the same direction rather than the opposite directions. In other words, the notch in the peripheral structure 21 and the notch 24 in the cross structure 23 both direct to the same direction to receive the corresponding engagement rivets 173 on the outer side 16 and engagement rivet 18 on the inner side 15. In this embodiment, the outer side 16 forms the slot 17 to independently hold the peripheral structure 21 while the inner side 15 is required to cooperate with another inner side 15 of the neighboring socket 10 to commonly form a slot structure to receive the cross structure 23.

However, the disclosure is illustrative only, changes may be made in detail, especially in matter of shape, size, and arrangement of sections within the principles of the invention.

What is claimed is:

1. An electrical connector comprising:

a frame including an exterior peripheral structure and an interior cross structure inside said peripheral structure;

a plurality of sockets attached to the frame, each of said sockets including a plurality of contacts disposed in an insulative housing, said insulative housing including two neighboring inner sides attached to the cross structure, and two neighboring outer sides which are located opposite to said two neighboring inner sides, respectively, and are attached to the peripheral structure, wherein the outer side forms a slot in an underside of the sockets to snugly receive the peripheral structure while the inner sides of neighboring sockets commonly form a slot structure to receive the cross structure.

2. The electrical connector as claimed in claim 1, wherein the socket forms a plurality of deformable engagement rivets to be deformed within corresponding notches in the frame.

3. The electrical connector as claimed in claim 2, wherein said engagement rivets are located upon both the outer sides and the inner sides, and the notches are formed in both the peripheral structure and the cross structure.

4. The electrical connector as claimed in claim 3, wherein said engagement rivet on the outer side and said engagement rivet on the opposite inner side both direct to a same direction.

5. The electrical connector as claimed in claim 3, wherein said notch in the peripheral structure and said notch in the corresponding cross structure both direct to a same direction.

6. The electrical connector as claimed in claim 1, wherein each of said contacts includes an upper resilient contacting section and a bottom solder ball.

7. The electrical connector as claimed in claim 1, wherein the inner side forms a plurality of protrusions so as to cooperate with those on the corresponding inner side of the neighboring socket in a zigzag manner.

8. The electrical connector as claimed in claim 7, wherein a plurality of deformable engagement rivets are formed upon the corresponding protrusions, respectively.

* * * * *